United States Patent [19]
Liu et al.

[11] Patent Number: 5,847,571
[45] Date of Patent: Dec. 8, 1998

[54] MEMBRANE PROBING OF CIRCUITS

[75] Inventors: Ken Kuang-Fu Liu, Saratoga; Byoung-Youl Min, Cupertino, both of Calif.; Kunio Sano, Yamanashi; Takashi Sato, Nirasaki, both of Japan

[73] Assignee: MicroModule Systems, Cupertino, Calif.

[21] Appl. No.: 675,416

[22] Filed: Jul. 3, 1996

Related U.S. Application Data

[63] Continuation of Ser. No. 303,510, Sep. 9, 1994, abandoned.

[51] Int. Cl.⁶ .................................................. G01R 1/073
[52] U.S. Cl. ........................................... 324/754; 324/757
[58] Field of Search ..................... 324/754, 757, 324/758, 760, 761, 762

[56] References Cited

U.S. PATENT DOCUMENTS

| | | | |
|---|---|---|---|
| 3,516,077 | 6/1970 | Bobeck et al. | 340/174 |
| 3,577,131 | 5/1971 | Morrow et al. | 340/174 |
| 3,673,433 | 6/1972 | Kupfer | 307/247 A |
| 3,934,236 | 1/1976 | Aiken et al. | 340/174 TF |
| 4,021,790 | 5/1977 | Aiken et al. | 340/174 TF |
| 4,117,543 | 9/1978 | Minnick et al. | 365/5 |
| 4,692,839 | 9/1987 | Lee et al. | 361/386 |
| 4,729,166 | 3/1988 | Lee et al. | 29/877 |
| 4,754,546 | 7/1988 | Lee et al. | 29/877 |
| 4,757,256 | 7/1988 | Whann et al. | 324/158 |
| 4,758,785 | 7/1988 | Rath | 324/754 |
| 4,778,950 | 10/1988 | Lee et al. | 174/356 C |
| 4,804,132 | 2/1989 | DiFrancesco | 228/115 |
| 4,912,399 | 3/1990 | Greub et al. | 324/754 |
| 4,918,383 | 4/1990 | Huff et al. | 324/158 F |
| 4,922,192 | 5/1990 | Gross et al. | 324/754 |
| 4,954,873 | 9/1990 | Lee et al. | 357/72 |
| 4,975,638 | 12/1990 | Evans et al. | 324/158 P |
| 4,980,637 | 12/1990 | Huff et al. | 324/159 P |
| 5,020,219 | 6/1991 | Leedy et al. | 29/845 |
| 5,072,176 | 12/1991 | Miller et al. | 324/158 |
| 5,083,697 | 1/1992 | Difrancesco | 228/116 |
| 5,103,557 | 4/1992 | Leedy | 29/832 |
| 5,132,613 | 7/1992 | Papae et al. | 324/158 |
| 5,180,977 | 1/1993 | Huff | 324/158 P |

(List continued on next page.)

FOREIGN PATENT DOCUMENTS

| | | |
|---|---|---|
| 0 298 219 | 11/1989 | European Pat. Off. . |
| 0 360 396 | 3/1990 | European Pat. Off. . |
| 0 361 779 | 4/1990 | European Pat. Off. . |
| WO 88/05444 | 7/1988 | WIPO . |

OTHER PUBLICATIONS

Chong et al., "The Evolution of MCM Test from High Performance Bipolar Mainframe Multichip Modules to Low Cost Work Station Multichip Modules," *ICEMM Proceedings '93*, pp. 404–410.

Doane, D. , "Foreward: Advancing MCM Technologies," *IEEE Transaction on Components, Packaging, and Manufacturing Technology—Part B: Advanced Packaging* (1994) 17(1):1.

(List continued on next page.)

*Primary Examiner*—Ernest F. Karlsen
*Attorney, Agent, or Firm*—Fish & Richardson P.C.

[57] ABSTRACT

First and second bumps electrically connected at first and second positions along a conductive run borne by a flexible substrate are respectively oriented for contact with a pad of a die under test and a pad of a tester. A probe frame is bonded to the substrate between connector frames bonded at opposite ends of the substrate. Alternatively, a pair of bumps exposed on the same surface of a flexible substrate are electrically connected at different positions along a conductive run. One of the bumps is oriented for contact with a pad of a die under test, and the other is in contact with a pad on a surface of a printed circuit board directed away from the die. The pad of the printed circuit board is provided for electrical connection to a tester.

3 Claims, 15 Drawing Sheets

U.S. PATENT DOCUMENTS

| | | | |
|---|---|---|---|
| 5,264,787 | 11/1993 | Woith et al. | 324/754 |
| 5,355,079 | 10/1994 | Evans et al. | 324/754 |
| 5,378,982 | 1/1995 | Feigenbaum et al. | 324/770 |
| 5,416,429 | 5/1995 | McQuade et al. | 324/754 |
| 5,422,574 | 6/1995 | Kister | 324/754 |
| 5,456,404 | 10/1995 | Robinette et al. | 228/104 |
| 5,468,157 | 11/1995 | Roebuck et al. | 439/264 |
| 5,469,072 | 11/1995 | William et al. | 324/754 |

OTHER PUBLICATIONS

Davidson, E., "Design, Analysis, Applications," *IEEE Transactions on Components, Packaging, and Manufacturing Technology—Part B: Advanced Packaging* (1994) 17(1):2.

Jenson, R., "Fabrication, Technology," *IEEE Transactions on Components, Packaging, and Manufacturing Technology—Part B: Advanced Packaging* (1994) 17(1):2.

Russell, T., "Testing," *IEEE Transactions on Components, Packaging, and Manufacturing Technology—Part B: Advanced Packaging* (1994) 17(1):2.

Marshall et al., "CAD–Based Net Capacitance Testing of Unpopulated MCM Substrates," *IEEE Transactions on Components, Packaging, and Manufacturing Technology—Part B: Advanced Packaging* (1994) 17(1):50–55.

Econmikos et al., "Electrical Test of Multichip Substrates," *IEEE Transactions on Components, Packaging, and Manufacturing Technology—Part B: Advanced Packaging* (1994) 17(1):56–61.

Brunner et al., "Electron–Beam MCM Testing and Probing," *IEEE Transactions on Components, Packaging, and Manufacturing Technology—Part B: Advanced Packaging* (1994) 17(1):62–68.

West, et al., *Principles of CMOS VLSI Design: A Systems Perspective,* 2nd Ed., (1993), Chapter 8.

Kister et al., "Test Cost Reduction Using the Membrane Probe" [Title Not Legible], *Probe Technology;* Santa Clara, CA.

Kister et al., "Test Cost Reduction Using the Membrane Probe", *Probe Technology;* Santa Clara, CA.

Fisher et al, "Reducing Test Costs for High–Speed and High Pin–Count Devices", *Probe Technology,* Feb. 1992; Santa Clara, CA.

*Fresh Quest Corporation,* "Fresh Quest Corporation Announces the Deliver of QC²™ Bare Die Carriers and QPC™ Probe Cards For the Production of Known Good Die"; Chandler, AZ.

*Fresh Quest Corporation,* "Quest Pricing Guidelines".

*Hewlett Packard,* "High Speed Wafer Probing with the HP 83000 Model F660"; 1993; Germany.

*Hughes Aircraft Company,* "Additional Technical Data for Hughes' Membrane Test Probe"; 1993.

*Hughes,* "Membrane Wafer Probe—The Future of the IC Test Industry".

*Packard Hughes Interconnect,* "Science Over Art, Our New IC Membrane Test Probe"; 1993; Irvine, CA.

*Packard Hughes Interconnect,* "Our New IC Membrane Test Probe. It's Priced the Same, But It Costs Less.", Irvine, CA; 1993.

*Probe Technology,* "Membrane Probe Card—The Concept".

*Probe Technology,* "Prober Interface Unit for HP83000 Model—INT768".

MEMBRANE PROBING OF CIRCUITS

This is a continuation of application Ser. No. 08/303,510, filed on Sep. 9, 1994, now abandoned.

BACKGROUND

This invention relates to membrane probing of circuits.

Circuits to be probed may include those which are formed as part of "dice" arranged in rows and columns on a silicon wafer during the process of making integrated circuits (IC's). Each die includes as many as a hundred or more aluminum input/output (I/O) pads for connecting the circuit on the die to the outside world. The pads are typically tiny and closely spaced, e.g., on the order of 100 microns center-to-center (pitch).

The performance and/or integrity of the dice circuits may be tested before the dice are cut out of the wafer and packaged. Testing is typically done by conductive probes that make physical and electrical contact with the die pads. Generally, the probes are either hard pins (e.g., tungsten), or hard bumps formed on a membrane surface. The close spacing of the die pads requires that the probes be carefully aligned, often by hand or by using a special visual alignment system. During testing, the probes are forced into contact with the pads.

Often, the sharp probe tips are wiped across the pads to abrade or scratch a thin layer of insulating aluminum oxide (which sometimes forms on the pads), thus exposing non-oxidized portions of the pads. Because the probe tips become dirty from this and other processes, they are periodically cleaned with an abrasive such as sandpaper.

During testing, the probes relay the appropriate power, data, and other signals between the die and a tester. The frequency at which these test signals are communicated (and thus also the testing rate) is determined at least in part by the inductance of the probes and the impedance of the electrical interconnections between the die and the tester.

SUMMARY

In one aspect of the invention, first and second bumps electrically connected at first and second positions along a conductive run borne by a flexible substrate are respectively oriented for contact with a pad of a die under test and a pad of a tester. A probe frame is bonded to the substrate between connector frames bonded at opposite ends of the substrate.

Among other advantages, the frames hold regions of the substrate in substantially inflexible orientations, facilitating electrical and mechanical contact between the bumps and the pads. For instance, an electrical connection between the first bump and the tester may be made by urging the probe frame toward the die, and one of the connector frames toward the tester. Thus, the conductive run need not be soldered or otherwise hard-wired to the tester, reducing the expense and difficulty of electrically interfacing the substrate and the tester. The connector frames may be releasably attached to the tester, allowing the substrate to be easily and rapidly removed. Should either of the bumps wear out, the substrate may be quickly replaced. Likewise, a die having a different pad arrangement may be tested using the same tester by substituting a substrate having a suitably oriented first bump.

Embodiments of the invention include the following features. Groups of first and second bumps interconnected by conductive runs may be respectively oriented for contact with corresponding groups of die and tester pads. The first group of bumps may be on a portion of the substrate that spans an open region enclosed by the probe frame (which is, e.g., bonded to a center region of the substrate). Likewise, the second group of bumps may be on either or both portions of the substrate that span open regions enclosed by the connector frames.

In another aspect of the invention, a pair of bumps exposed on the same surface of a flexible substrate are electrically connected at different positions along a conductive run. One of the bumps is oriented for contact with a pad of a die under test, and the other is in contact with a pad on a surface of a printed circuit board directed away from the die. The pad of the printed circuit board is provided for electrical connection to a tester.

Among other advantages of this aspect of the invention, because the pad of the printed circuit board is disposed on the surface directed away from the die, a mechanism for forcing the second bump into contact with the pad can also be disposed, in whole or in part, on or near this surface. This greatly simplifies the design of a forcing mechanism that will not contact or otherwise interfere with the die, which is typically brought into close proximity with the printed circuit board during testing.

Embodiments of the invention may include the following features. The pad of the printed circuit board may be disposed adjacent a hole in the printed circuit board, and the first bump may be aligned with the hole. A pressure mechanism may be attached to the printed circuit board.

Other features and advantages of the invention are apparent from the following description, and from the claims.

DESCRIPTION

FIG. 1b is another cross-sectional view of the testing apparatus, taken along a section line perpendicular to the section line of the view shown in FIG. 1a.

Figure 1A:
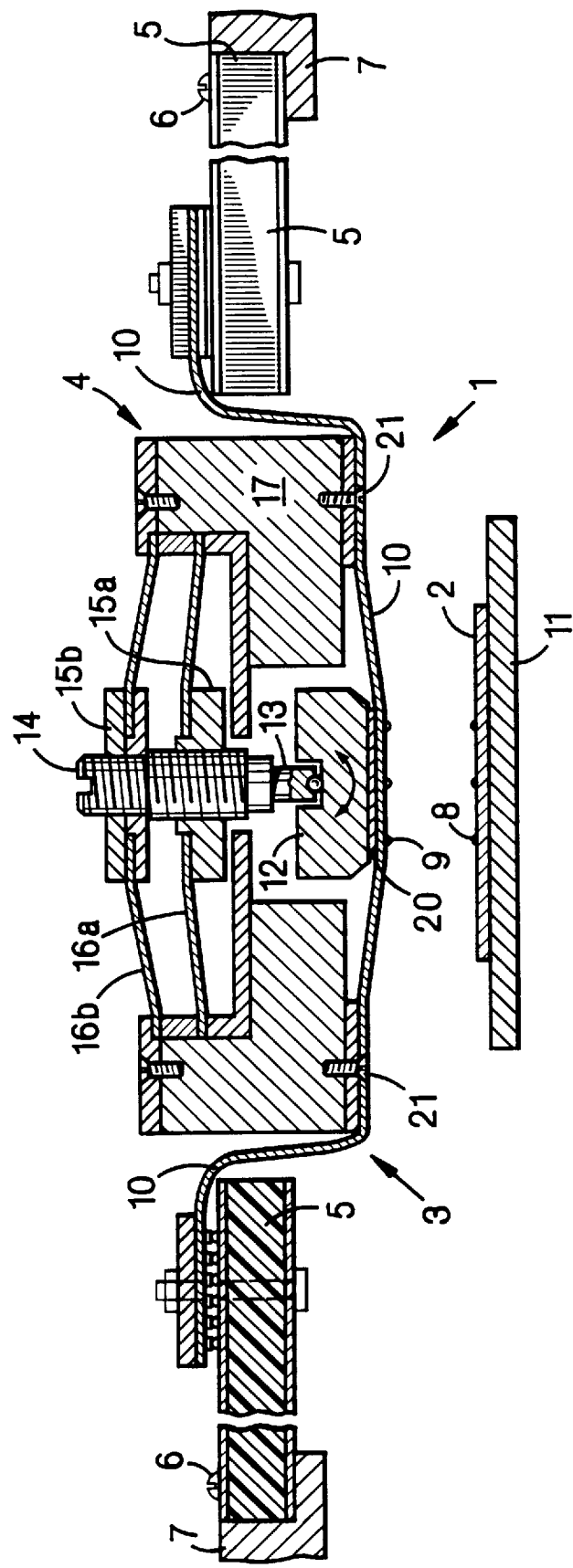
FIG. 1a is a cross-sectional view of a testing apparatus.
Figure 1B:
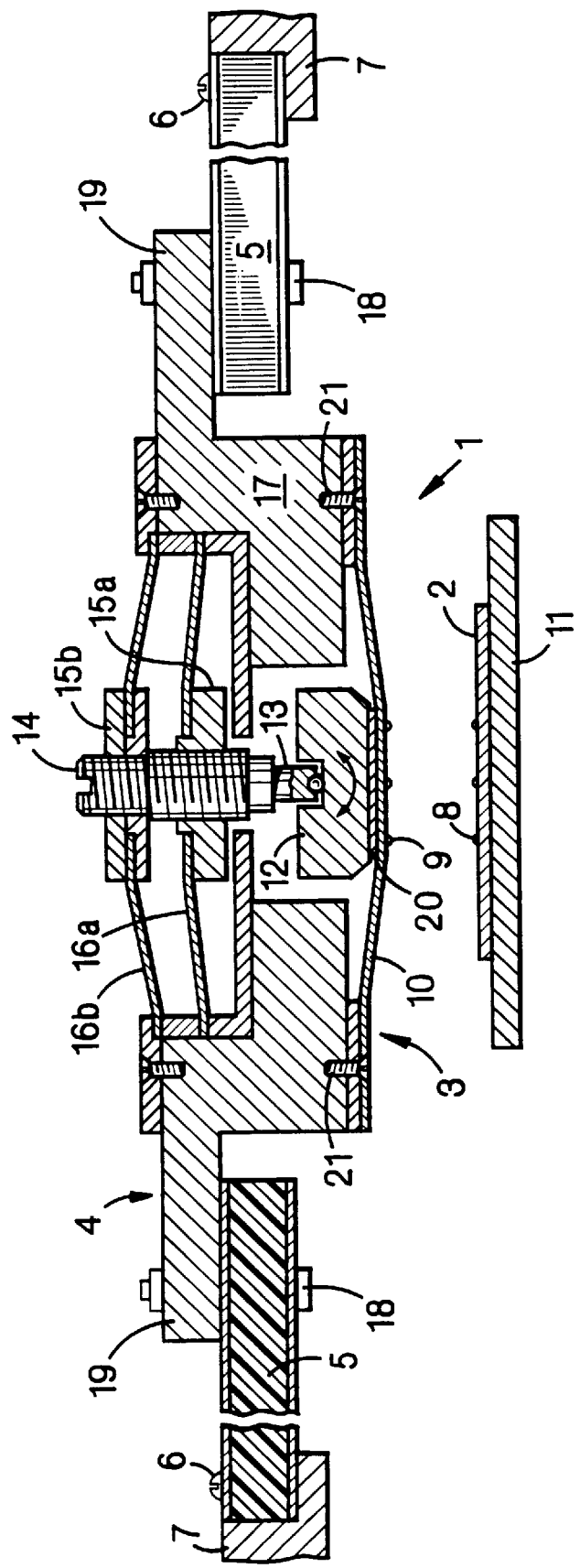
Figure 1C:
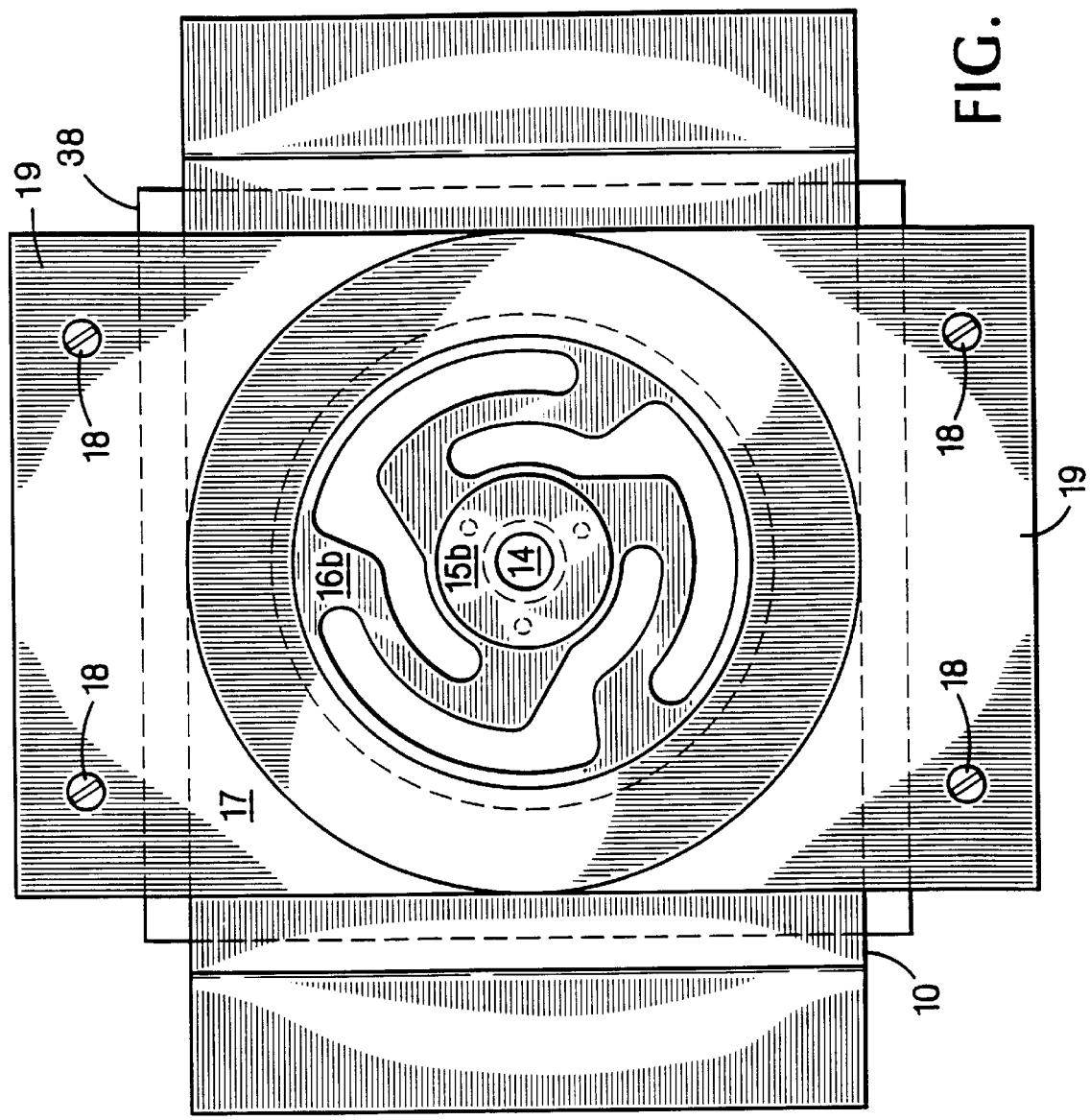
FIG. 1c is a top view of the testing apparatus.

Referring to FIGS. 1a, 1b, and 1c, a testing apparatus 1 for testing dice on a silicon wafer 2 includes a membrane assembly 3 and a pressure mechanism 4, both attached to a printed circuit board (PCB) 5 (PCB 5 is not shown in FIG.

1c). Screws 6 attach PCB 5 to a housing 7. Pressure mechanism 4 maintains a suitable contact force between the pads 8 of a die (not shown) on wafer 2 and conductive bumps 9 (e.g., of nickel, gold, or copper) exposed on a membrane 10 of membrane assembly 3. Bumps 9, which are arranged in accordance with the locations of the pads 8 of the die under test, electrically connect to a tester (not shown). Wafer 2 is held fixed by a vacuum chuck 11. Prior to testing, vacuum chuck 11 is moved laterally with respect to membrane 10 to align die pads 8 under membrane bumps 9. When wafer 2 and membrane 10 are properly oriented, vacuum chuck 11 is then moved vertically with respect to PCB 5, forcing die pads 8 into mechanical and electrical contact with bumps 9. The tester can then exchange signals with, provide power to, and evaluate the performance of, the die.

Pressure mechanism 4 includes a pusher 12 connected, through a ball-and-socket joint 13, to the base of a threaded rod 14. Sleeves 15a, 15b thread onto rod 14, and attach at the centers of belleville springs 16a, 16b. Belleville springs 16a, 16b are substantially umbrella-shaped--round when viewed from the top (FIG. 1c), and frusto-conical when viewed from the sides. The periphery of each spring 16a, 16b attaches to a support block 17. Screws 18 attach flanges 19 of support block 17 to PCB 5.

An elastic plate 20 on the end of pusher 12 contacts the back side of membrane 10 in the region of bumps 9. Screws 21 attach membrane assembly 3 to support block 17. When die pads 8 are forced into contact with membrane bumps 9, pusher 12 rotates, about ball-and-socket joint 13, with respect to rod 14, allowing membrane 10 to orient parallel to wafer 2 so that all of bumps 9 may come into contact with their respective pads 8.

During testing, pusher 12 also moves vertically with respect to support block 17, causing belleville springs 16a, 16b to deflect. Thus, the spring constant and preload of springs 16a, 16b, which may be adjusted by turning threaded rod 14, determines the contact force between bumps 9 and pads 8. Generally, this force is large enough to maintain reliable electrical interconnection between bumps 9 and pads 8, but not so great as to damage either of them.

Figure 1D:
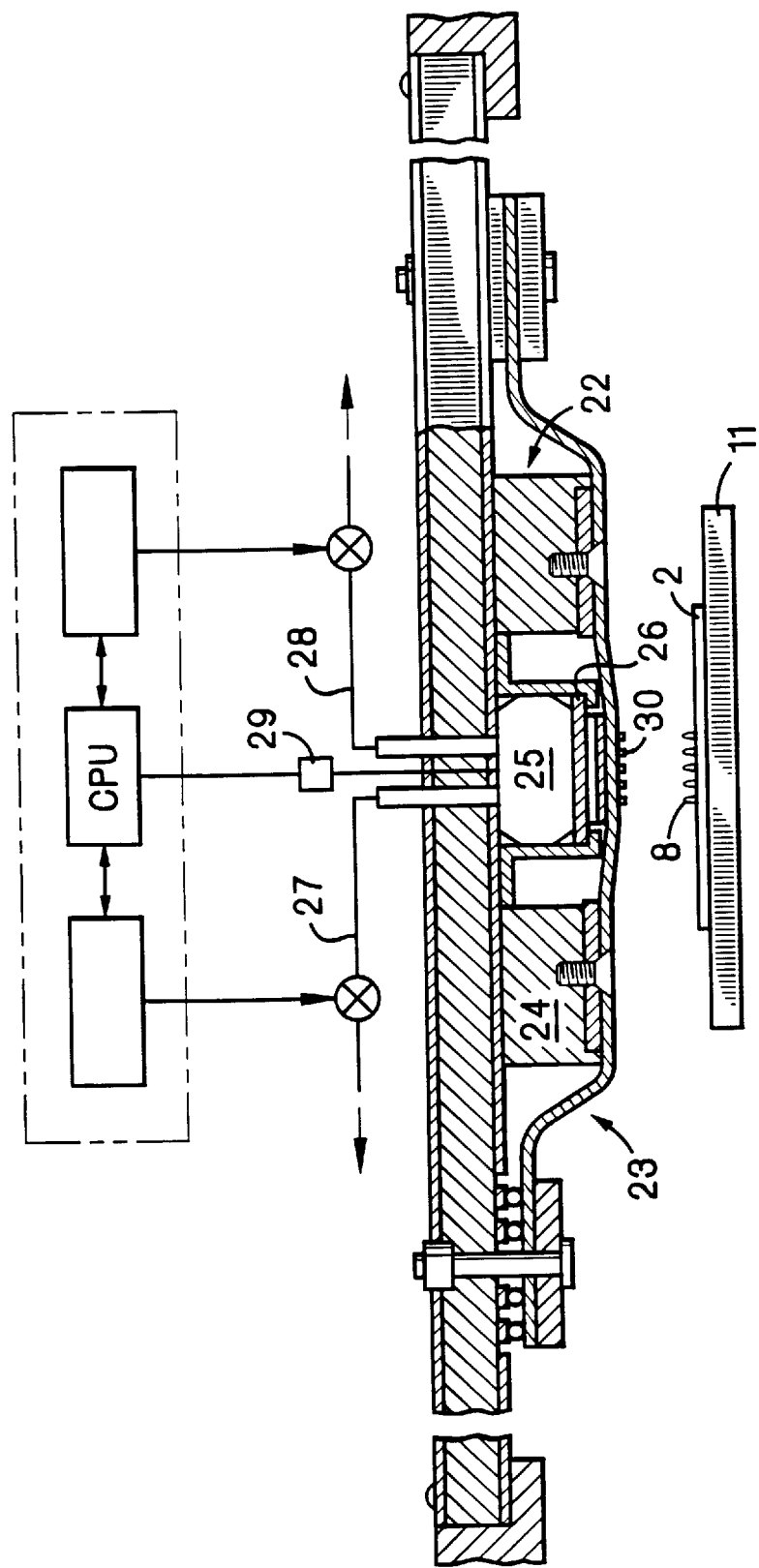
FIG. 1d is a cross-sectional view of another testing apparatus.

An alternate pressure mechanism 22 for use with a similar membrane assembly 23 is shown in FIG. 1d. A support block 24 in pressure mechanism 22 houses an expandable fluid chamber 25. Membrane assembly 23 is attached to the bottom surface of support block 24, and a pushing plate 26 on the bottom of fluid chamber 25 contacts the back side of membrane assembly 23 in the region of bumps 9. Valved lines 27, 28 supply fluid (e.g., liquid or gas) to and withdraw fluid from chamber 25. A CPU monitors the signal generated by a pressure transducer 29 in fluid communication with chamber 25, opening and closing the valves in lines 27, 28 to maintain the desired pressure level in chamber 25.

Prior to testing, the CPU reduces the pressure in chamber 25 to essentially zero. Wafer 2 is then moved vertically until die pads 8 are close to, but not touching, membrane bumps 30 of membrane assembly 23. The pressure in chamber 25 is then increased to some predetermined level, forcing bumps 30 into contact with pads 8. As this occurs, rigid pushing plate 26 rotates, allowing bumps 30 to orient parallel to wafer 2 so that all of bumps 30 may come into contact with pads 8.

Figure 2:
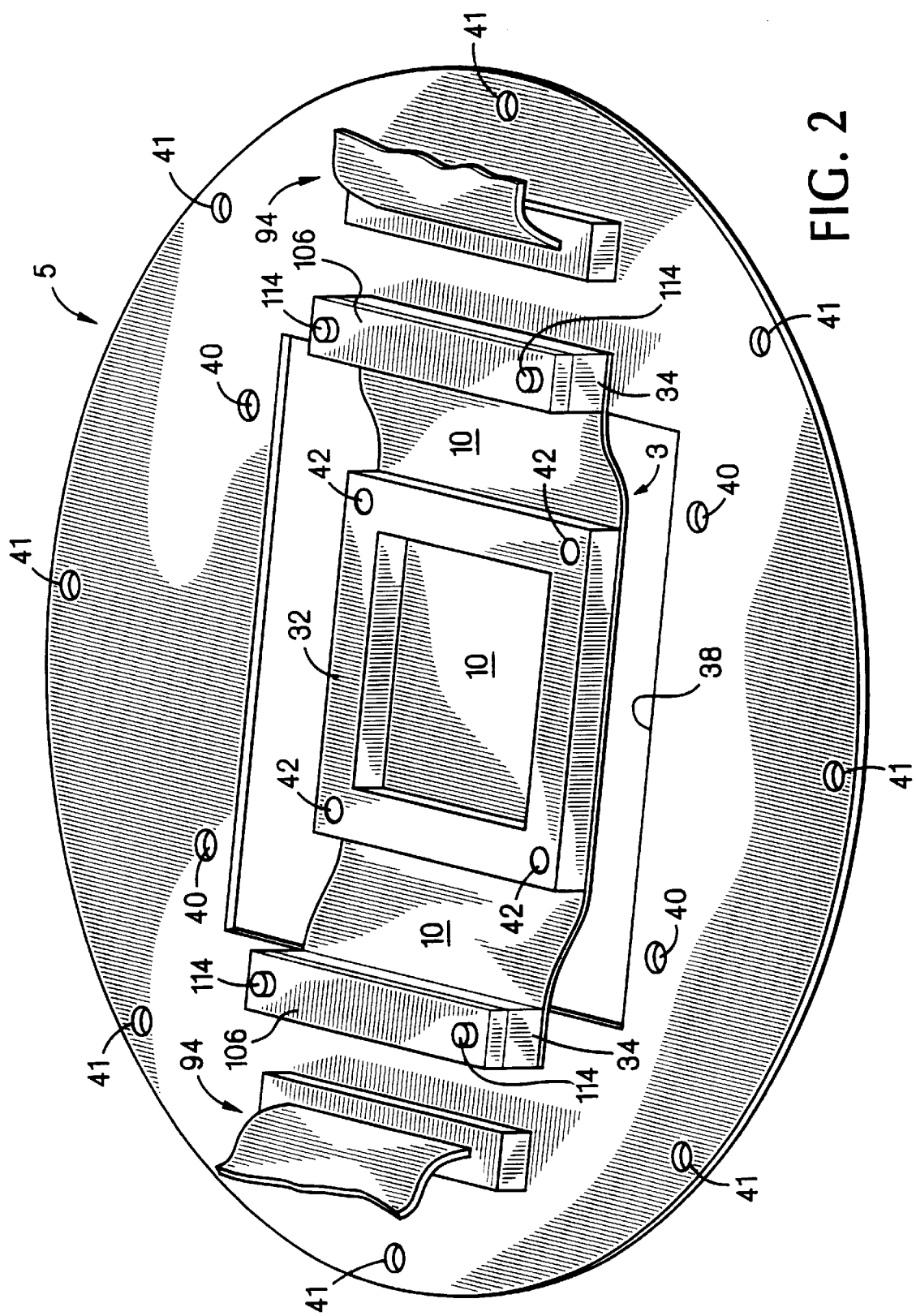
FIGS. 2–4 are perspective, top, and sectional (taken along line 4—4 in FIG. 3) views, respectively, of a membrane probe card of the testing apparatus of FIGS. 1a, 1b, and 1c.
Figure 3:
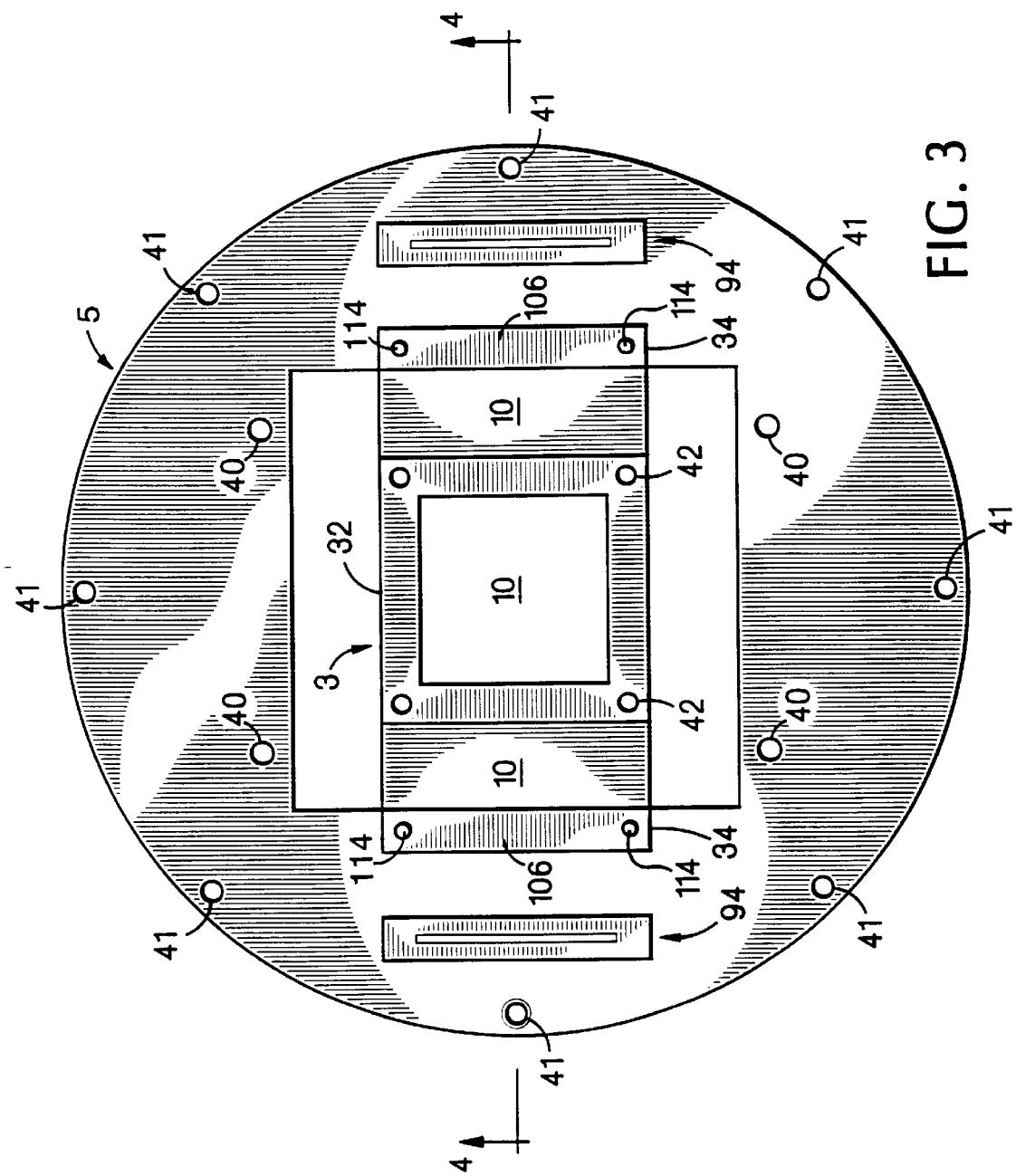
Figure 4:
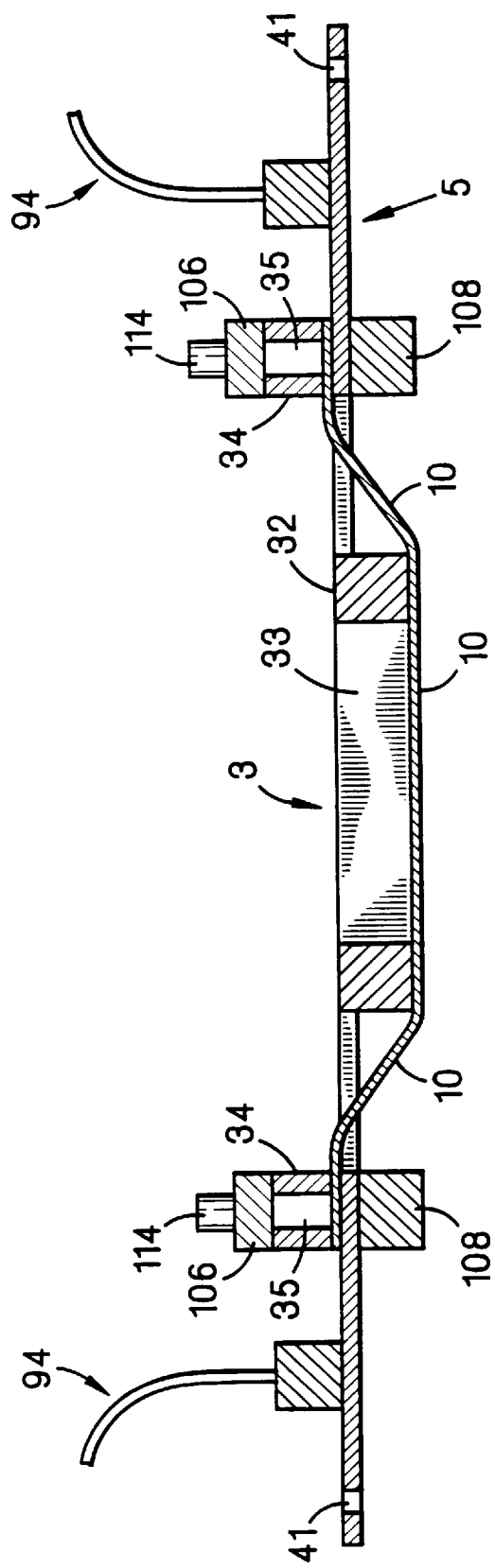

Referring to FIGS. 2–4, membrane assembly 3 comprises membrane 10, a square probe frame 32 bonded at the center of membrane 10, and a pair of rectangular connector frames 34 bonded at opposite ends of membrane 10. Four holes 42, one in each corner of probe frame 32, accept screws 21 (FIGS. 1a and 1b) for attaching probe frame 32 to support block 17 of pressure mechanism 4. Probe frame 32 encloses an open region 33, spanned by membrane 10 like a drum head. When membrane assembly 3 is used with pressure mechanism 4, pusher 12 sits in region 33, as does expandable chamber 25 when pressure mechanism 22 is used. Connector frames 34 likewise enclose open regions 35, spanned by membrane 10.

As described below in connection with FIGS. 10 and 11, screws 114 and top pressure plates 106 attach connector frames 34 to the edges of a square hole 38 in the center of circular PCB 5. (PCB 5 is shown smaller than the scale of hole 38 in FIGS. 2–4.) Probe frame 32 is thus suspended between connector frames 34 in square hole 38. Because membrane 10 is flexible, and also because membrane 10 is longer than the width of hole 38, probe frame 32 can move vertically with respect to connector frames 34 and PCB 5. When probe frame 32 is at its lowest point of travel, membrane 10 is roughly U-shaped in cross-section. Four holes 40, two on either side of square hole 38, accept screws 18 (FIG. 1b) for attaching flanges 19 of support block 17 to PCB 5. Holes 41, located at equal circumferential intervals around the periphery of PCB 5, are positioned to receive screws 6 (FIGS. 1a and 1b) to attach PCB 5 to housing 7.

Figure 5:
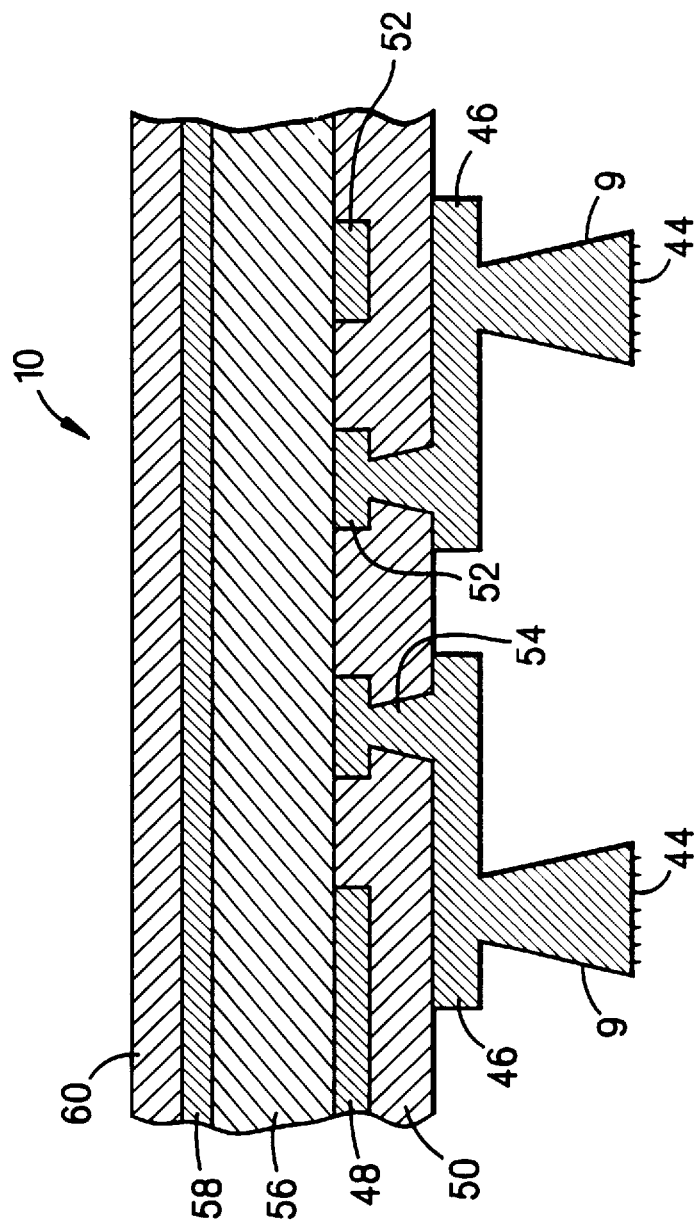
FIG. 5 is a cross-sectional view of a portion of a membrane of the membrane probe card.

As shown in FIG. 5, the bottom surfaces of bumps 9 of membrane 10 are plated with particles 44. Particles 44, comprised, e.g., of nickel coated with gold or rhodium, are relatively hard and angular, with sharp points suitable for penetrating aluminum oxide accumulations on the surface of the die pads. Bumps 9 attach to bump pads 46 on the bottom surface of membrane 10, and thus bumps 9 are exposed on the bottom surface of membrane 10. Bump pads 46 are electrically insulated from a signal and reference layer 48 by a bottom dielectric layer 50. The conductive portions of signal and reference layer 48 are formed, in a manner described below, from a 4 micron copper sheet. Dielectric layer 50 is a 10 micron layer of a polymer such as polyimide. Signal and reference layer 48 includes signal runs 52, which electrically interconnect with bump pads 46 through conductive vias 54 passing through bottom dielectric layer 50. Signal runs 52 are generally between 16 and 20 microns wide. A middle dielectric layer 56 (e.g., a 10–20 micron polyimide layer) electrically insulates signal and reference layer 48 from a power and ground layer 58, the conductive portions of which are formed from a 4 micron copper sheet. A top dielectric layer 60 (e.g., a 10 micron polyimide layer) is located on top of power and ground layer 58.

Figure 6:
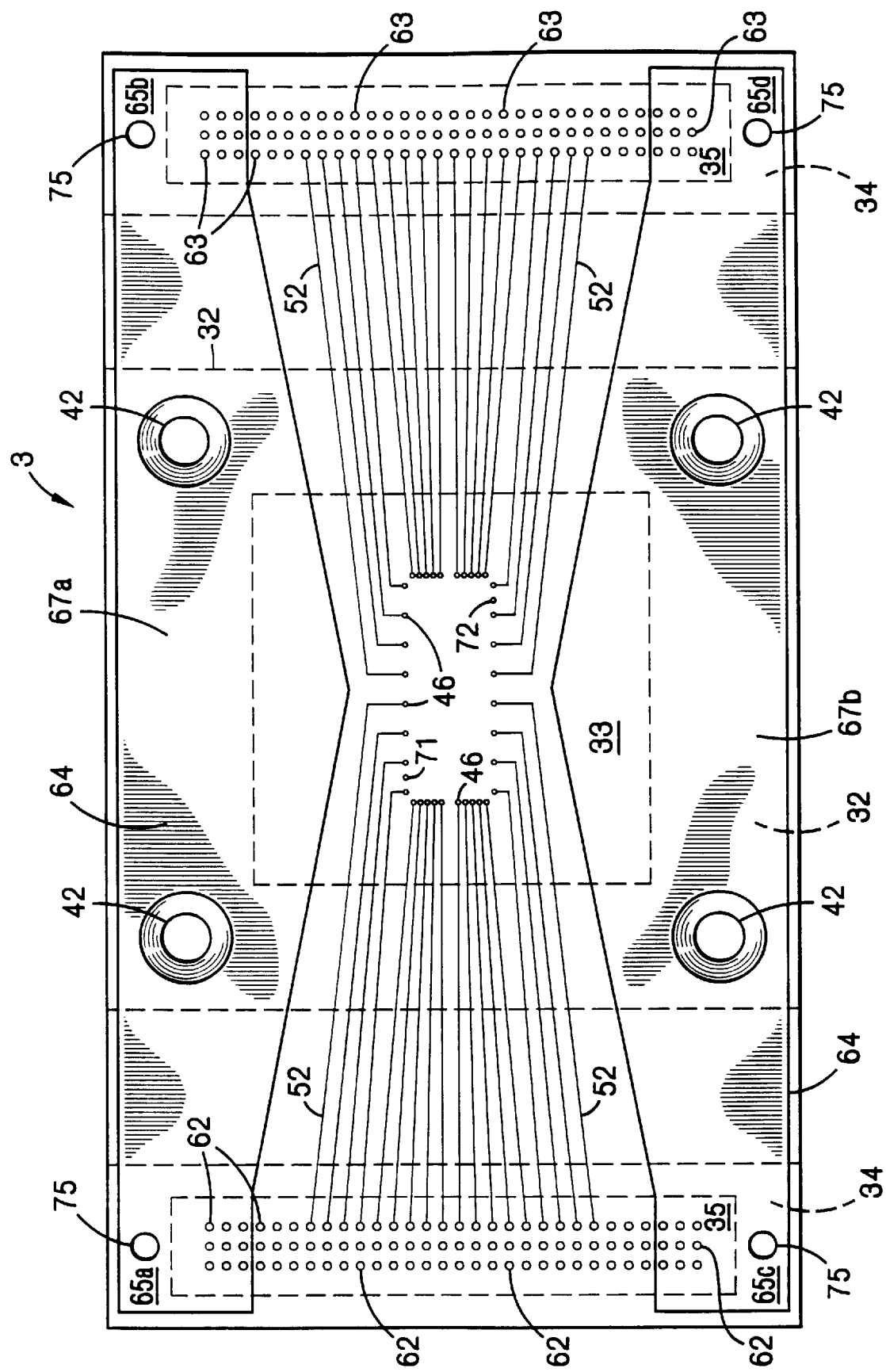
FIG. 6 is a bottom view of a membrane assembly of the membrane probe card.

Referring also to FIG. 6, bump pads 46 are grouped on the portion of membrane 10 that spans open region 33 of probe frame 32. In particular, bump pads 46 are arranged to correspond to pads 8 of the die to be tested in apparatus 1. Two other sets of bump pads 62, 63 are arranged, in 3 pad×30 pad matrices, on the portion of membrane 10 that spans open regions 35 of connector frames 34. Each signal run 52 extends from a point directly above a bump pad 46 within the center region of probe frame 32 to a point directly above a bump pad 62, 63 within the center region of one of connector frames 34. (For clarity, signal runs 52 are shown solid—not in phantom—in FIG. 6, although it can be seen from FIG. 5 that signal runs 52 do not lie in the same plane as bump pads 46, 62, 63.) A via (not shown in FIG. 6) at each end of each signal run 52 connects the signal runs to the corresponding bump pad 46, 62, 63 located directly below.

A conductive Vref region 64 flanks signal runs 52 in layer 48. (For clarity, Vref region 64 is shown solid—not in phantom—in FIG. 6, although Vref region 64 lies in the same plane as signal runs 52). Vias (not shown in FIG. 6) connect Vref region 64 to the bump pads 62, 63 located directly below it. Thus, as shown in FIG. 6, each end 65a, 65b, 65c, 65d of each portion 67a, 67b of Vref region 64 connects to the nine bump pads 62, 63 located directly below it. Also as shown in FIG. 6, holes 42 are countersunk or chamfered on the bottom surface of membrane assembly 3.

Figure 7:
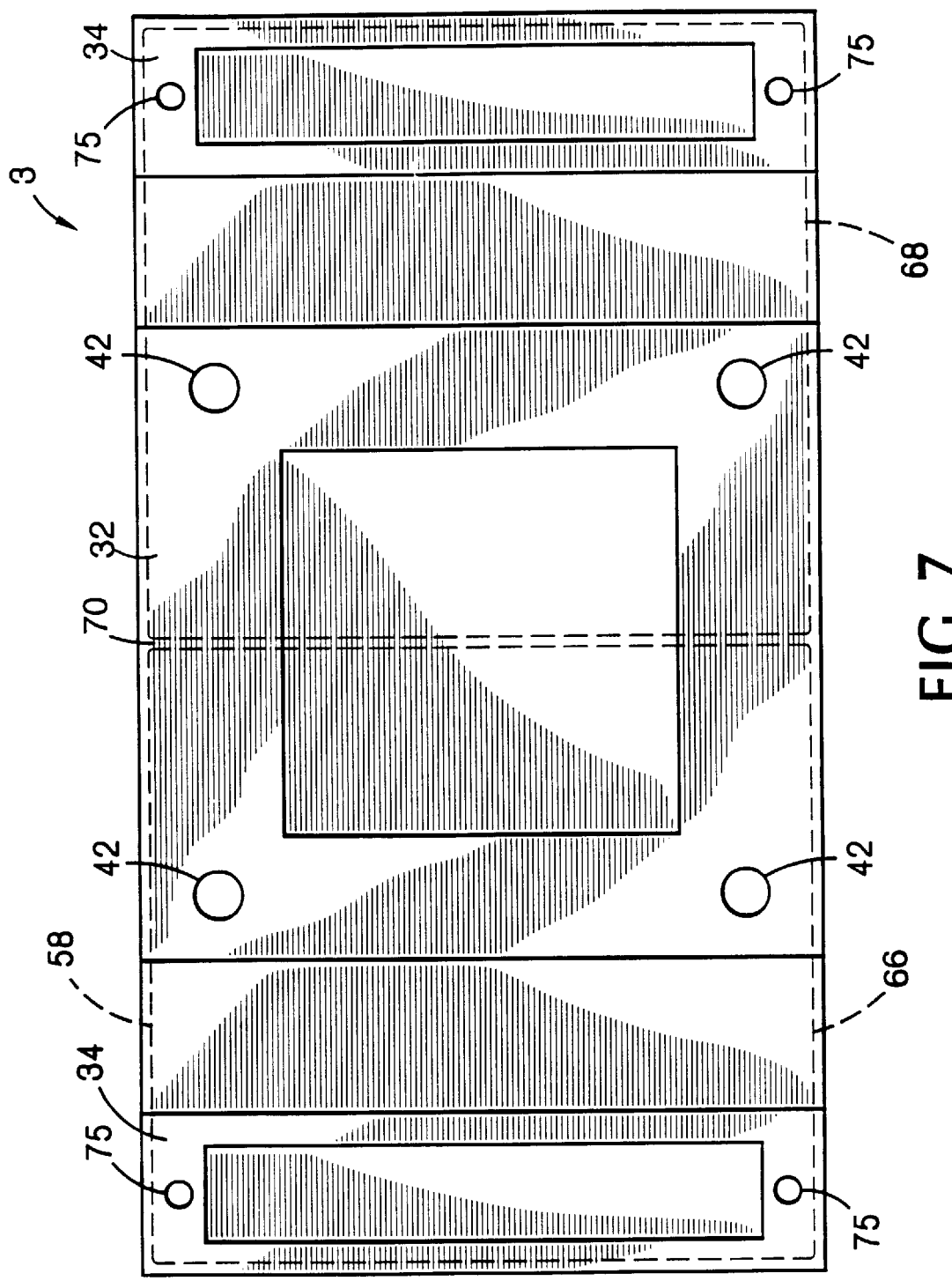
FIG. 7 is a top view of the membrane assembly.

As shown in FIG. 7, power and ground layer 58 includes a rectangular conductive Vcc region 66 that extends across approximately half the length of power and ground layer 58, and a conductive Vss region 68 that extends across approximately the other half of the length of power and ground layer 58. Apart from a narrow, nonconductive strip 70 that separates Vcc region 66 from Vss region 68, Vcc region 66 and Vss region 68 together occupy substantially all of power and ground layer 58. Because of their proximity, Vref region 64 and Vcc region 66 together comprise as a capacitor, as do Vref region 64 and Vss region 68.

Vias (not shown in FIG. 7) connect Vcc region 66 and Vss region 68 to the respective bump pads 62, 63 located directly below it that are not otherwise connected to either Vref region 64 or a signal run 52. Another via connects Vcc region 66 to a bump pad 71, the associated bump 9 of which is oriented to contact the power pad of the die under test. Vss region 68 is likewise connected to a bump pad 72, the associated bump 9 of which is oriented to contact the ground pad of the die under test.

Figure 8:
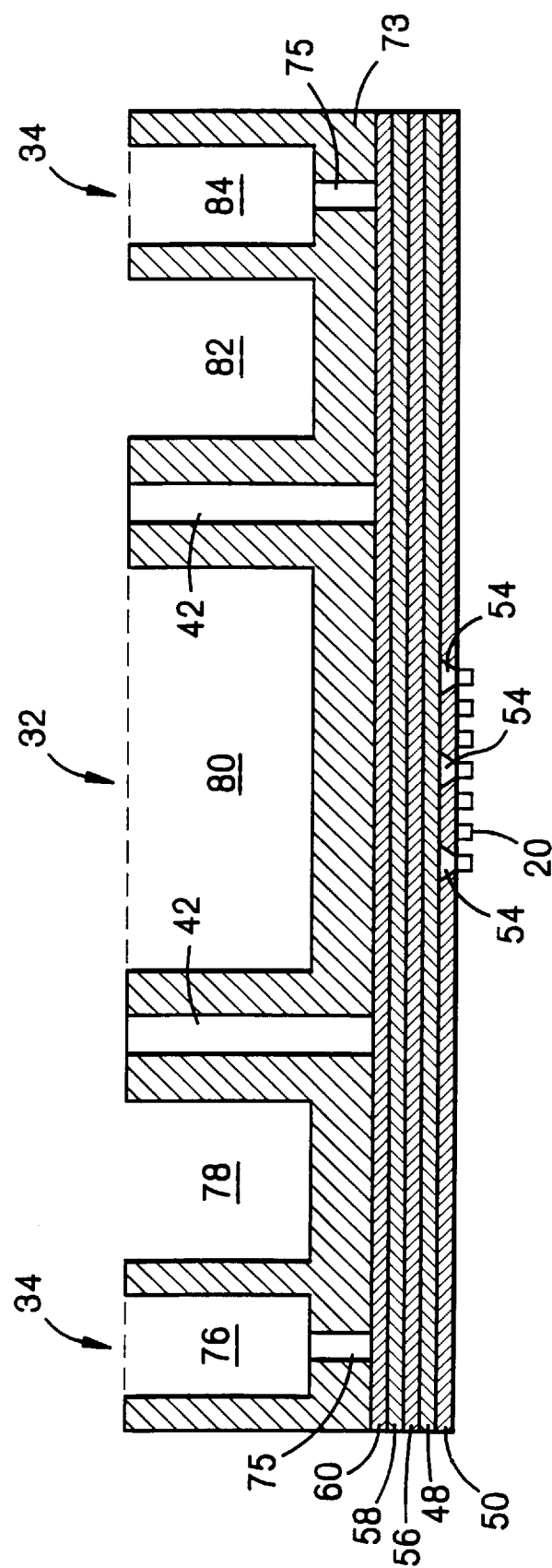
FIG. 8 is a cross-sectional view, not to scale, of a membrane assembly at an intermediate stage of manufacture.

As shown in FIG. 8, to manufacture membrane assembly 3, polyimide layer 60 is first formed, using conventional techniques, on the bottom surface of a solid substrate, such as a 0.050 in. thick aluminum wafer 73. As described below, probe frame 32 and connector frames 34 are formed from aluminum wafer 73. In this manner, polyimide layer 60 forms a durable mechanical bond with the surface of aluminum wafer 73. Power and ground layer 58 is then formed by sputtering a 4 micron copper layer onto the exposed surface of layer 60, and then using photo lithography to remove the unwanted conductive material to form Vcc region 66 and Vss region 68. Polyimide layers 50, 56, signal and reference plane 48, vias 54, and bump pads 46 are formed using similar conventional techniques. Bumps 9 are then grown at the desired locations on bump pads 46 and plated with particles 44, such as in the manner described in U.S. Pat. Nos. 4,804,132 and 5,083,697, incorporated herein by reference.

When membrane 10 is completely formed, the bottom surface of membrane 10 is covered with either or both pressure sensitive tape or photoresist. This protects membrane 10, and in particular bumps 9 and particles 44, from mechanical abrasion or chemical attack during the subsequent manufacturing steps.

Next, attachment holes 42 and alignment holes 75 are drilled through aluminum wafer 73. Recesses 76, 78, 80, 82, 84 are then mechanically machined into the top surface of aluminum wafer 73. Recesses 76, 84 correspond to the openings in connector frames 34, and recess 80 corresponds to the opening in probe frame 32. Recesses 78, 82 correspond to the gaps between connector frames 34 and probe frame 32. Recesses 76, 78, 80, 82, 84 are machined until they extend about 80% of the way through aluminum wafer 73. Thus, for a 0.050 in. substrate, the recesses are machined to a depth of about 0.040 in.

Any number of methods can be used to machine recesses 76, 78, 80, 82, 84. Milling, high-speed routing, electro-discharge machining (EDM), or beadblasting through a mask are all viable techniques, depending on precision and cost constraints.

After recesses 76, 78, 80, 82, 84 have been machined, the recesses are chemically etched to remove the remaining 20% of the aluminum substrate material, exposing the top surface of membrane 10. Any number of chemical etchants may be used, as long as the polyimide layer 60 is not chemically attacked by it. Typically, the etchant temperature is carefully controlled to provide a constant etch rate. Because only 20% of the substrate material is removed by etching, the etchant does not substantially undercut the remaining substrate material, even when an isotropic etchant is used.

Figure 9:
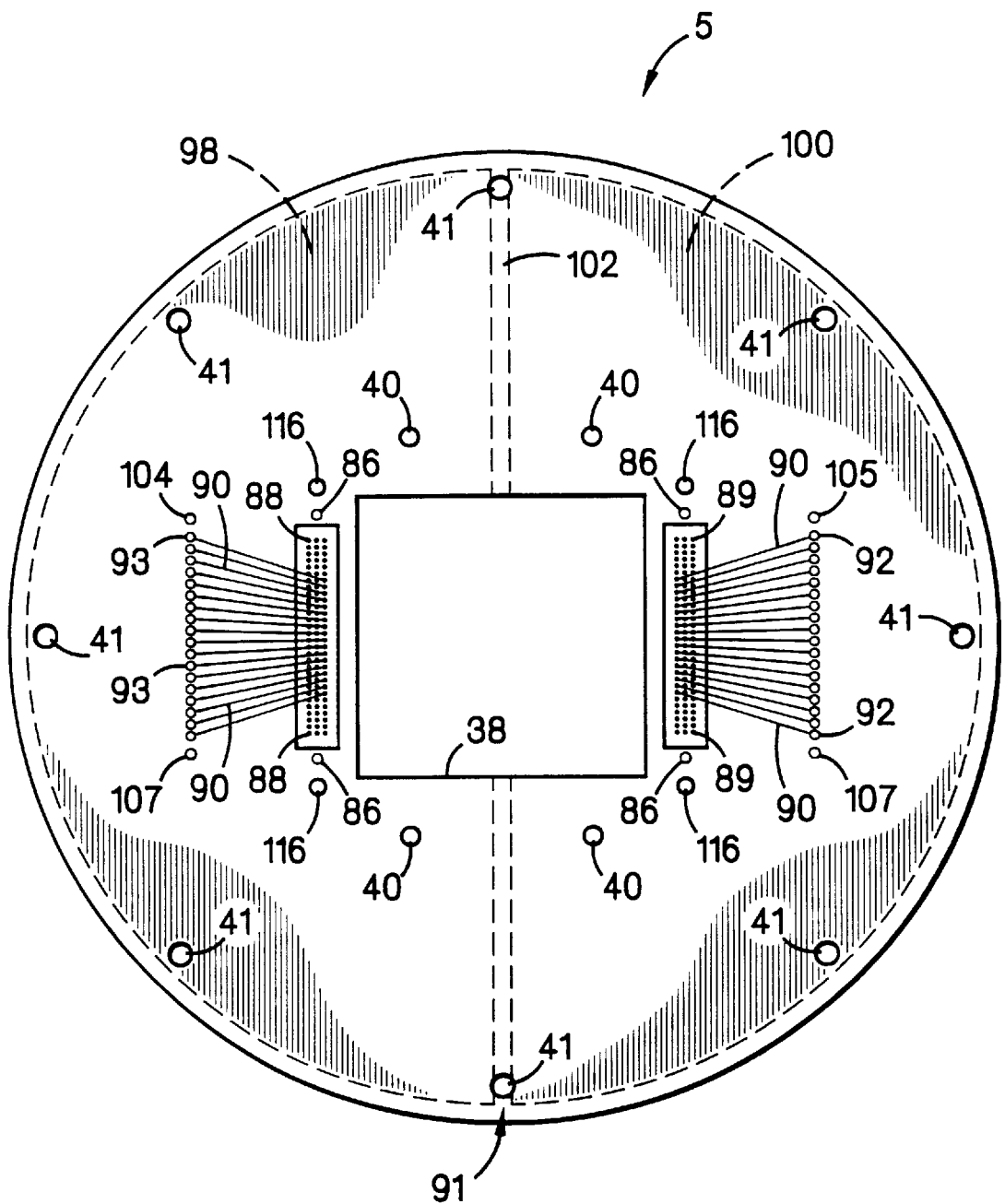
FIG. 9 is a top view of a printed circuit board of the membrane probe card.

After etching, the protective material covering bumps 9 on the bottom surface of membrane 10 is removed, and membrane assembly 3 is mounted to PCB 5. PCB 5, shown approximately to scale in FIG. 9, includes four alignment pins 86 sized and located to seat in alignment holes 75 in connector frames 34. Disposed between alignment pins 86, and adjacent to hole 38, are two 3×30 matrices of pads 88, 89. Pads 88, 89 are arranged to correspond to bump pads 62, 63 of membrane assembly 3. With connector frames 34 mechanically attached to PCB 5, as described below in connection with FIGS. 10 and 11, the membrane bumps 9 associated with bump pads 62 make contact with pads 88, and the membrane bumps 9 associated with bump pads 63 make contact with pads 89. Membrane bumps 9, and the particles 44 plated thereupon, penetrate aluminum oxide accumulations on the surface of pads 88, 89, facilitating the electrical interconnection between bump pads 62, 63 and respective pads 88, 89. Thus, when membrane assembly 3 is properly installed on PCB 5, pads 88, 89 are electrically interfaced with pads 62, 63 of membrane assembly 3.

Those pads 88, 89 that interface with bump pads 62, 63 connected to Vref region 64 electrically connect through vias to a conductive PCB Vref region 91 that substantially covers the bottom surface of PCB 5. An insulating material covers the bottom surface of PCB Vref region 91.

Those pads 88, 89 that interface with bump pads 62, 63 connected to Vcc region 66 and Vss region 68 electrically connect through vias to a conductive PCB Vcc region 98 and a conductive PCB Vss region 100, respectively. Apart from a narrow, nonconductive strip 102 that separates PCB Vcc region 98 from PCB Vss region 100, PCB Vcc region 98 and PCB Vss region 100 together cover substantially the entire top surface of PCB 5. Similar to membrane assembly 3, because of their proximity, PCB Vref region 91 and PCB Vcc region 98 together serve as a capacitor, as do PCB Vref region 91 and PCB Vss region 100. A pad 104 electrically connects to PCB Vcc region 98, a pad 105 electrically connects to PCB Vss region 100, and pads 107 electrically connects to PCB Vref region 91.

Those pads 88, 89 that interface with bump pads 62, 63 connected to signal runs 52 electrically connect through conductive PCB runs 90 to pads 92. An insulting material disposed on the top surface of PCB Vss region 100 and PCB Vcc region 98 insulates PCB runs 90 from PCB Vss region 100 and PCB Vcc region 98.

A connector block/ribbon cable assembly 94 (shown in FIGS. 2–4) electrically connects to each set of pads 92, as well as to pads 104, 105, 107, relaying power, data, and other signals between PCB 5 and the tester. In particular, pad 104 (which electrically connects to Vcc regions 66, 98 of both PCB 5 and installed membrane assembly 3) is connected to the positive terminal of a power supply (not shown) in the tester. Pad 105 (which electrically connects to Vss regions 68, 100 of both PCB 5 and installed membrane assembly 3) is connected to the negative terminal of the power supply in the tester. Pad 107 (which electrically connects to Vref regions 64, 91 of both PCB 5 and installed membrane assembly 3) is connected to the system, or chassis, ground of the tester.

Figure 10:
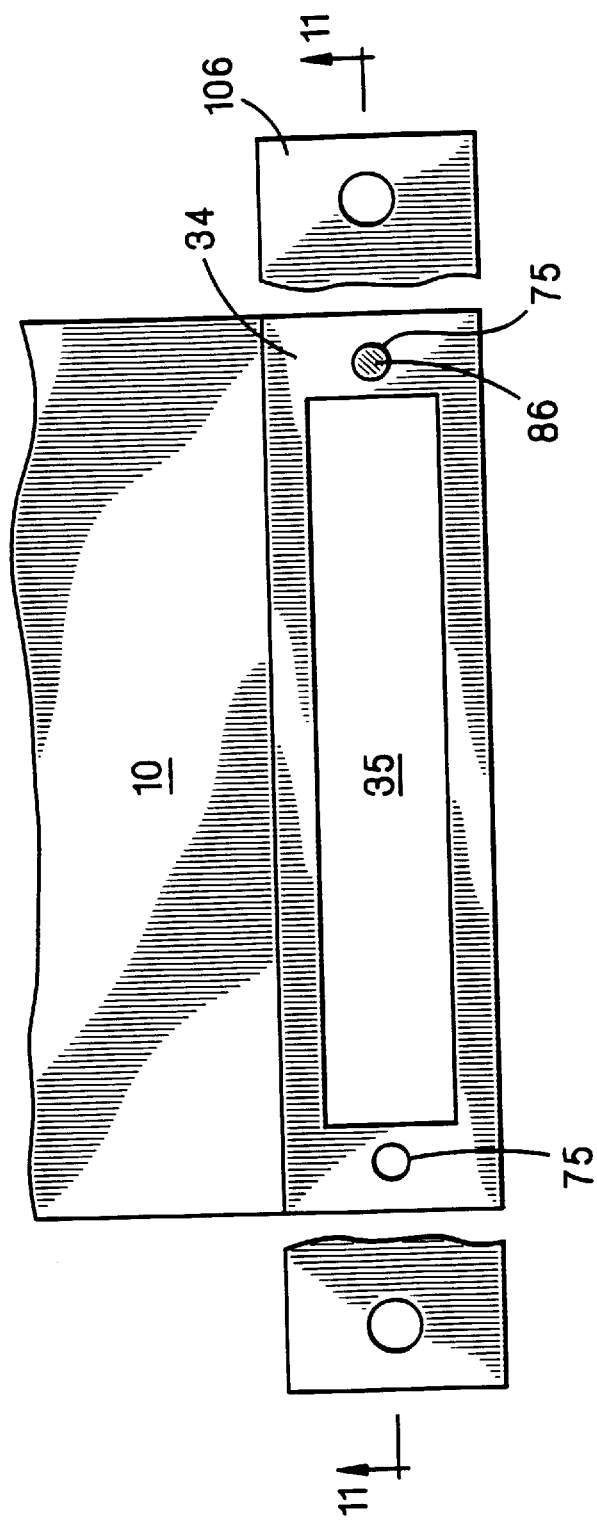
FIGS. 10 and 11 are broken-away top and sectional views (taken along line 11—11 in FIG. 10), respectively, of a mechanism for attaching the membrane assembly to the printed circuit board.
Figure 11:
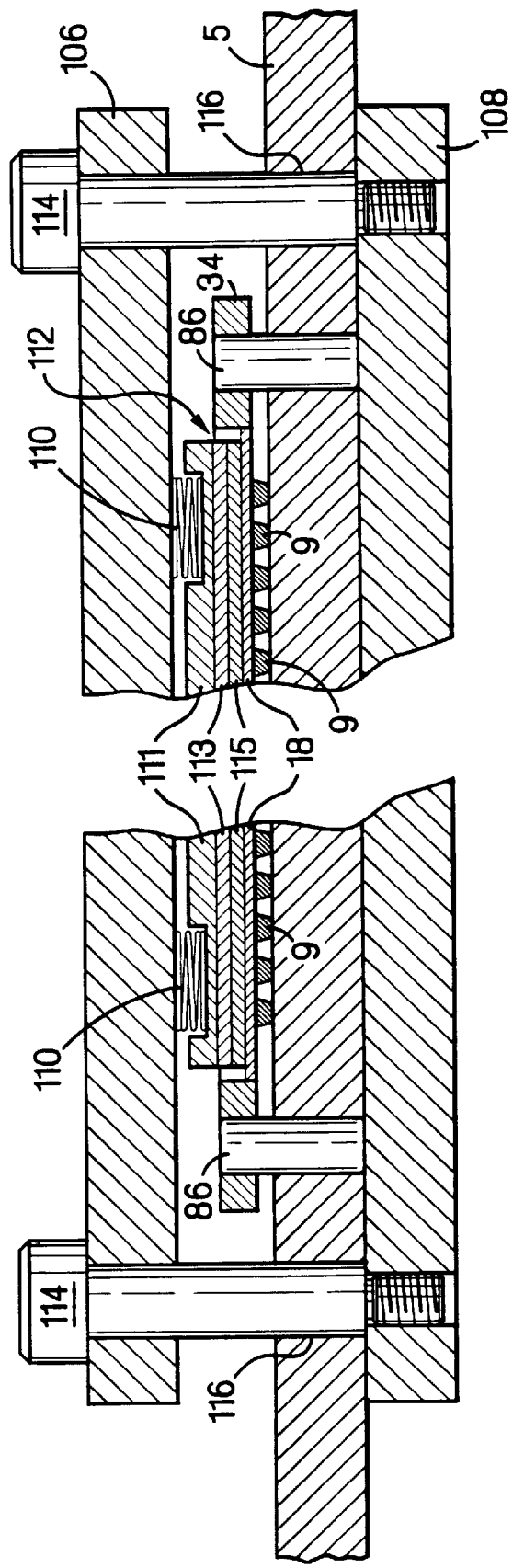

As shown in FIGS. 10 and 11, the lateral alignment of bump pads 62, 63 with respect to pads 88, 89 is maintained by alignment pins 86 in PCB 5, which seat in alignment holes 75 of connector frames 34. To force bumps 9 against pads 88, 89, connector frame 34 and PCB 5 are sandwiched between a top pressure plate 106 and a bottom pressure plate 108, both of which are constructed of a rigid material such as stainless steel. Pressure springs 110 and a pressure uniformity cushion 112 are disposed between membrane 10 and top pressure plate 106. Cushion 112 includes a compliant layer 111 (e.g., rubber) sandwiched between a stainless steel layer 113 and a layer of plastic material 115 (e.g., Kapton). Cushion 112 rests in opening 76 in connector frame 34, with stainless steel layer 113 disposed adjacent to springs 110, and Kapton layer 115 disposed adjacent to the top surface of membrane 10. As pressure screws 114 (which pass through holes 116 in PCB 5) are tightened, pressure plates 106, 108 are drawn closer together. The resultant loading is distributed evenly by springs 110 and pressure uniformity cushion 112 over the surface of membrane 10, ensuring that bumps 9 engage pads 88, 96, 104 with substantially uniform force.

Should bumps 9, particles 44, or some other portion of membrane assembly 3 wear out, membrane assembly 3 can be replaced with a fresh assembly by simply disassembling the releasable attachment mechanism shown in FIGS. 10 and 11, removing the spent assembly, orienting a fresh membrane on alignment pins 86 at the edges of hole 38, and reassembling the mechanism.

In operation, after silicon wafer 2 is positioned in testing apparatus 1, vacuum chuck 11 is activated to hold wafer 2 fixed. Vacuum chuck 11 is then moved laterally with respect to membrane 10 to align the die pads with the membrane bumps 9. With the die pads properly oriented, vacuum chuck 11 is moved vertically to force the die pads into electrical contact with bumps 9, providing a plurality of continuous current flow paths between the die pads and the tester electrically connected to connector block/ribbon cable assembly 94.

Figure 12:
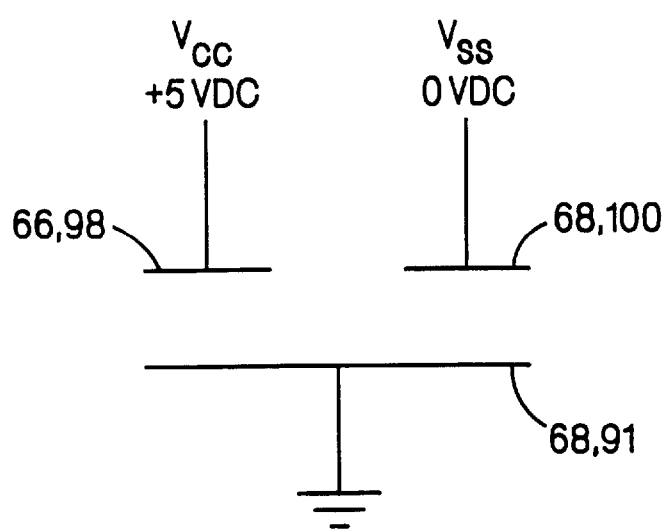
FIG. 12 is a schematic illustration of the Vcc, Vss, and Vref regions of the membrane assembly and the printed circuit board connected to power supply power, power supply ground, and system ground, respectively.

Activating the tester supplies power, typically +5 volts DC (VDC), to Vcc regions 66, 98 (and thus pad 71) through pad 104. As noted above, Vss regions 68, 100 (and thus pad 72) and Vref regions 68, 91 are electrically connected to power supply ground (i.e., 0 VDC) and system ground through pads 105 and 107, respectively. After the power supply is switched on, the tester supplies test signals to the die, generally at high frequency to increase the die testing rate. The resultant high-frequency switching of transistors in the die causes corresponding high-frequency, low-amplitude fluctuations in the power demanded by the die. Because Vref regions 68, 91, Vcc regions 66, 98, and Vss regions 68, 100 serve as series capacitor networks between Vcc and Vss, as illustrated schematically in FIG. 12, these fluctuations in power demand do not result in substantial fluctuations in the Vcc and Vss voltage levels. Thus, the arrangement of the conductive Vcc, Vss, and Vref regions AC couples the Vcc and Vss regions to one another, serving to filter or attenuate high frequency noise from the otherwise nominally constant power and ground signals.

Other embodiments are within the claims.

For example, although membrane assembly 3 has been shown and described as attached to a printed circuit board, any suitable interface structure, such as a frame or other fixture, may be used. In addition, although pressure uniformity cushion 112 contacts membrane 10 directly, an attachment mechanism could instead apply force directly to connector frames 34 to force bumps 9 into contact with pads 88, 96, 104 of PCB 5. Moreover, bumps 9 need not be plated with particles 44.

What is claimed is:

1. Apparatus for providing a conductive path from a pad of a die under test to a pad of a tester structure, said apparatus comprising:

a generally rectangular flexible substrate having surfaces and bearing a conductive run;

a first electrically conductive bump exposed on one of said surfaces and electrically connected at a first position along said conductive run, said first bump oriented for contact with said pad of said die under test;

a second electrically conductive bump exposed on one of said surfaces and electrically connected at a second position along said conductive run, said second bump oriented for contact with said pad of said tester structure;

said first bump and said second bump being exposed on the same one of said surfaces;

a pair of connector frames bonded at opposite ends of said substrate, at least one of said connector frames enclosing an open region spanned by only a portion of said substrate including said second bump; and a probe frame bonded to said substrate at a position between said connector frames, said probe frame enclosing an open region spanned by only a portion of said substrate including said first bump.

2. The apparatus of claim 1 wherein said probe frame is bonded to a center region of said substrate.

3. The apparatus of claim 1 further comprising:

multiple conductive runs borne by said flexible substrate;

multiple first bumps oriented for contact with multiple pads of said die under test, each of said first bumps being electrically connected at a first position along one of said conductive runs; and multiple said second bumps oriented for contact with multiple pads of said tester structure, each of said second bumps being electrically connected at a second position along one of said conductive runs.

* * * * *